(12) United States Patent
Summers et al.

(10) Patent No.: US 8,357,753 B2
(45) Date of Patent: Jan. 22, 2013

(54) SCREEN-PRINTABLE ENCAPSULANTS BASED ON POLYHYDROXYAMIDES THAT THERMALLY CONVERT TO POLYBENZOXAZOLES

(75) Inventors: John D. Summers, Chapel Hill, NC (US); Thomas Eugene Dueber, Wilmington, DE (US)

(73) Assignee: CDA Processing Limited Liability Company, Wilmington, DE (US)

( * ) Notice: Subject to any disclaimer, the term of this patent is extended or adjusted under 35 U.S.C. 154(b) by 793 days.

(21) Appl. No.: 12/141,137

(22) Filed: Jun. 18, 2008

(65) Prior Publication Data
US 2009/0023858 A1 Jan. 22, 2009

Related U.S. Application Data

(60) Provisional application No. 60/950,483, filed on Jul. 18, 2007.

(51) Int. Cl.
*C08G 69/32* (2006.01)
*C08G 69/26* (2006.01)
*C08G 69/46* (2006.01)
*H01G 4/224* (2006.01)

(52) U.S. Cl. ........ 524/606; 528/179; 528/184; 528/185; 528/347; 528/348; 361/301.3

(58) Field of Classification Search .......... 524/606; 528/179, 184, 185, 347, 348; 361/301.3
See application file for complete search history.

(56) References Cited

U.S. PATENT DOCUMENTS

| | | | |
|---|---|---|---|
| 4,820,793 A | 4/1989 | Imai et al. | |
| 4,931,532 A | 6/1990 | Reinhardt | |
| 5,011,753 A | 4/1991 | Mueller et al. | |
| 5,883,221 A | 3/1999 | Sezi et al. | |
| 5,993,698 A * | 11/1999 | Frentzel et al. | 252/511 |
| 6,204,356 B1 | 3/2001 | Saito et al. | |
| 6,317,023 B1 | 11/2001 | Felten | |
| 6,410,677 B1 * | 6/2002 | Enoki et al. | 528/170 |
| 6,423,815 B1 | 7/2002 | Nakajima et al. | |
| 6,518,390 B2 | 2/2003 | Okanuma et al. | |
| 6,860,000 B2 | 3/2005 | Felten | |
| 6,929,891 B2 | 8/2005 | Rushkin et al. | |
| 7,064,176 B2 | 6/2006 | Halik et al. | |
| 7,192,997 B2 | 3/2007 | Papathomas | |
| 2003/0143480 A1 * | 7/2003 | Ueda et al. | 430/192 |
| 2004/0138406 A1 | 7/2004 | Halik et al. | |
| 2004/0152862 A1 | 8/2004 | Takasaki et al. | |
| 2005/0011857 A1 | 1/2005 | Borland et al. | |
| 2005/0248015 A1 * | 11/2005 | Palanduz | 257/684 |
| 2005/0271881 A1 * | 12/2005 | Hong | 428/423.1 |
| 2007/0154105 A1 | 7/2007 | Adachi et al. | |

(Continued)

FOREIGN PATENT DOCUMENTS

| | | |
|---|---|---|
| GB | 2188936 A | 10/1987 |
| GB | 2189788 A | 11/1987 |

(Continued)

OTHER PUBLICATIONS

Dimethyl Sulfoxide (DMSO) Solubility Data; Bulletin # 102B; Gaylord Chemical Company; Oct. 2007.*

(Continued)

*Primary Examiner* — Michael Pepitone

(57) ABSTRACT

This invention relates to compositions, and the use of such compositions for protective coatings, particularly of electronic devices. The invention concerns fired-on-foil ceramic capacitors coated with a composite encapsulant and embedded in a printed wiring board.

17 Claims, 4 Drawing Sheets

U.S. PATENT DOCUMENTS

| | | |
|---|---|---|
| 2007/0236859 A1 | 10/2007 | Borland et al. |
| 2007/0244267 A1 | 10/2007 | Dueber et al. |
| 2007/0290379 A1 | 12/2007 | Dueber et al. |
| 2007/0291440 A1 | 12/2007 | Dueber et al. |

FOREIGN PATENT DOCUMENTS

| | | |
|---|---|---|
| WO | 2007034716 A1 | 3/2007 |
| WO | 2008073410 A2 | 6/2008 |

OTHER PUBLICATIONS

European Search Report dated Aug. 20, 2009, European Application No. EP 08 25 2447.

P. J. Walsh et al., Environmental Effects of Poly-P-Phenylenebenzobisoxazole Fibers. II. Attempts at Stabilization, Journal of Applied Polymer Science, 2006, Vol. 102, p. 3819-3829.

M. D. Houtz et al., Polymer Degradation Studies of Fluorinated Polymers: Thermal Behavior of 6-F-PBO, Polymer Preprints, 1994, Vol. 35, p. 437-438.

L. R. Denny et al., The Preparation, Thermomechanical Properties and Applications of High Temperature Thermoplastic Polybenzoxazoles Containing Hexafluorinated Moieties, 22nd International SAMPE Technical Conference, Nov. 6-8, 1990, p. 186-197.

T. E. Deuber et al., Screen-Printable Encapsulants Based on Soluble Polybenzoxazoles, U.S. Appl. No. 11/949,914, filed Dec. 4, 2007.

\* cited by examiner

SCREEN-PRINTABLE ENCAPSULANTS BASED ON POLYHYDROXYAMIDES THAT THERMALLY CONVERT TO POLYBENZOXAZOLES

CROSS-REFERENCE TO RELATED APPLICATIONS

The present application claims the benefit of U.S. Provisional Patent Application No. 60/950,483, filed on Jul. 18, 2007, the entire contents of which is incorporated herein by reference in their entirety.

FIELD OF THE INVENTION

This invention relates to compositions, and the use of such compositions for protective coatings. In one embodiment, the compositions are used to protect electronic device structures, particularly embedded fired-on-foil ceramic capacitors, from exposure to printed wiring board processing chemicals and for environmental protection.

TECHNICAL BACKGROUND OF THE INVENTION

Electronic circuits require passive electronic components such as resistors, capacitors, and inductors. A recent trend is for passive electronic components to be embedded or integrated into the organic printed circuit board (PCB). The practice of embedding capacitors in printed circuit boards allows for reduced circuit size and improved circuit performance. Embedded capacitors, however, must meet high reliability requirements along with other requirements, such as high yield and performance. Meeting reliability requirements involves passing accelerated life tests. One such accelerated life test is exposure of the circuit containing the embedded capacitor to 1000 hours at 85% relative humidity, 85° C. under 5 volts bias. Any significant degradation of the insulation resistance would constitute failure.

High capacitance ceramic capacitors embedded in printed circuit boards are particularly useful for decoupling applications. High capacitance ceramic capacitors may be formed by "fired-on-foil" technology. Fired-on-foil capacitors may be formed from thick-film processes as disclosed in U.S. Pat. No. 6,317,023B1 to Felten or thin-film processes as disclosed in U.S. Patent Application 20050011857 A1 to Borland et. al.

Thick-film fired-on-foil ceramic capacitors are formed by depositing a thick-film capacitor dielectric material layer onto a metallic foil substrate, followed by depositing a top copper electrode material over the thick-film capacitor dielectric layer and a subsequent firing under copper thick-film firing conditions, such as 900-950° C. for a peak period of 10 minutes in a nitrogen atmosphere.

The capacitor dielectric material should have a high dielectric constant (K) after firing to allow for manufacture of small high capacitance capacitors suitable for decoupling. A high K thick-film capacitor dielectric is formed by mixing a high dielectric constant powder (the "functional phase") with a glass powder and dispersing the mixture into a thick-film screen-printing vehicle.

During firing of the thick-film dielectric material, the glass component of the dielectric material softens and flows before the peak firing temperature is reached, coalesces, encapsulates the functional phase, and finally forms a monolithic ceramic/copper electrode film.

The foil containing the fired-on-foil capacitors is then laminated to a prepreg dielectric layer, capacitor component face down to form an inner layer and the metallic foil may be etched to form the foil electrodes of the capacitor and any associated circuitry. The inner layer containing the fired-on-foil capacitors may now be incorporated into a multilayer printed wiring board by conventional printing wiring board methods.

The fired ceramic capacitor layer may contain some porosity and, if subjected to bending forces due to poor handling, may sustain some microcracks. Such porosity and microcracks may allow moisture to penetrate the ceramic structure and when exposed to bias and temperature in accelerated life tests may result in low insulation resistance and failure.

In the printed circuit board manufacturing process, the foil containing the fired-on-foil capacitors may also be exposed to caustic stripping photoresist chemicals and a brown or black oxide treatment. This treatment is often used to improve the adhesion of copper foil to prepreg. It consists of multiple exposures of the copper foil to caustic and acid solutions at elevated temperatures. These chemicals may attack and partially dissolve the capacitor dielectric glass and dopants. Such damage often results in ionic surface deposits on the dielectric that results in low insulation resistance when the capacitor is exposed to humidity. Such degradation also compromises the accelerated life test of the capacitor.

It is also important that, once embedded, the encapsulated capacitor maintain its integrity during downstream processing steps such as the thermal excursions associated with solder reflow cycles or overmold baking cycles. Delaminations and/or cracks occurring at any of the various interfaces of the construction or within the layers themselves could undermine the integrity of the embedded capacitor by providing an avenue for moisture penetration into the assembly.

An approach to solve these issues is needed. Various approaches to improve embedded passives have been tried. An example of an encapsulant composition used to reinforce embedded resistors may be found in U.S. Pat. No. 6,860,000, issued to Felten. A crystalline polyimide precursors approach for an organic encapsulant has been described with PCT Patent Application No. PCT/US07/25297. Other polyimide-based encapsulants have been described in U.S. Patent Applications US-2007-0290379-A and US-2007-0291440-A. An approach to organic encapsulants with polynorbornene and polyarylates is U.S. Patent Application US-2007-0154105-A.

Epoxy materials have been described as encapsulants. K. I. Papathomas in U.S. Pat. No. 7,192,997 B2 describes a composition for use in making an encapsulant usable in the encapsulation of a semiconductor chip. Other references using epoxy plus phenolic resins are U.S. Patent Applications US-2007-0244267-A and US-2007-0236859-A.

Polybenzoxazoles may have utility as encapsulants since they generally possess low diffusion coefficients to moisture and gases, high degree of dimensional stability, high toughness, high Tg, low to moderate Cites, low water uptake, and good adhesion. However, in the investigation of the use of polybenzoxazoles in fibers, a problem was identified. With poly-p-phenylenebenzobisoxazole fibers, P. J. Walsh et. al., in the Journal of Applied Polymer Science, Vol. 102, 3819-3829 (2006)], there were issues identified with hydrolytic reactions of weak bases and acids, such as morpholine, pyridine and trimethylphosphate that were used to extract residual phosphoric acid. There was evidence that there were hydrolytic reactions involving the oxazole nitrogen that led to disruption of the oxazole ring structure.

Polybenzoxazoles that are claimed to be soluble in the literature that are based on a solubilizing diamine component, 2,2-bis(3-amino-4-hydroxyphenyl)hexafluoropropane (6F-AP) were described by L. R. Denny et. al. at the $22^{nd}$ International SAMPE Technical Conference, Nov. 6-8, 1990 and by Houtz et. al., Polymer Preprints, 1994, 35 (1), 437-8. These references describe a search for thermoplastic canopy materials that are tolerant towards aerodynamic heating needed to aid in high speed Air Force applications. The PBOs identified were soluble in non-screen print solvents such as methanesulfonic acid, sulfuric acid, chloroform or THF.

In U.S. Pat. No. 7,064,176B to Halik et. al., soluble polyhydroxyamides that thermally convert to PBOs, were prepared to be used as adhesives to bond chips to electronic packages. Solvents that are infinitely soluble in water were used to spin coat the polymer solutions onto wafers. For screen print applications, most of the solvents indicated are too low boiling and have too much water absorption. The higher boiling solvents indicated, NMP and gamma-butyrolactone, attack the screen emulsion, the squeegee, and are infinitely soluble in water, which makes these solvents unusable for screen-printing.

In WO 2007/034716 A1 to M. Hasegawa et. al., a sulfone-containing PBO is described that has high solubility in solvents, but the highly polar sulfone functionality is anticipated to cause higher than desired moisture absorption into an encapsulated capacitor that is subjected to up to 1000 hours in an 85° C., 85% RH with a 5 volt DC bias.

SUMMARY OF THE INVENTION

The invention concerns a fired-on-foil ceramic capacitor coated with an organic encapsulant that forms a protective coating after a high temperature cure and is embedded in a printed wiring board. The encapsulant consists of a polyhydroxyamide with a water absorption of 2% or less; optionally one or more electrically insulated fillers, a defoamer and a colorant and one or more organic solvents. The polyhydroxyamide is a polybenzoxazole (PBO) precursor and is chosen such that it is soluble in one or more conventional screen printing solvents. The polyhydroxyamide is also chosen so that the PBO after cure has a high enough Tg, above 260° C. and preferably above 300° C.

Compositions are disclosed comprising: a polyhydroxyamide, optionally one or more electrically insulated fillers, defoamers and colorants and an organic solvent. The compositions have a consolidation temperature of about 450° C. or less.

The invention is also directed to a method of encapsulating a fired-on-foil ceramic capacitor with an encapsulant, the encapsulant comprising a polyhydroxyamide with a water absorption of 2% or less; optionally one or more electrically insulated fillers, defoamers and colorants and an organic solvent. The encapsulant is then cured at a temperature equal to or less than about 450° C.

The inventive compositions containing the organic materials can be applied as an encapsulant to any other electronic component or mixed with inorganic electrically insulating fillers, defoamers, and colorants, and applied as an encapsulant to any electronic component.

DETAILED DESCRIPTION OF THE INVENTION

Figure 1A:
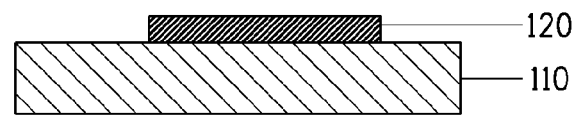
FIG. 1A through 1G show the preparation of capacitors on commercial 96% alumina substrates that were covered by the composite encapsulant compositions and used as a test vehicles to determine the composite encapsulant's resistance to selected chemicals.

The following definitions are used herein to further define and describe the invention.

As used herein and recited in the claims, the term "a" includes the concepts of "at least one" or "one or more than one".

The present invention provides an unexpected, novel, superior encapsulant composition that allows for screen-printing and the formation of a polybenzoxazole encapsulant, and thus allowing for an embedded capacitor comprising a superior encapsulant and superior properties.

The use of incorporating polybenzoxazoles into thick film formulations is largely unexplored as is the approach of using a soluble polyhydroxyamide intermediate, which is more soluble than the thermally rearranged polybenzoxazole is in the screen printing solvent. Of particular interest for encapsulant applications is utilizing diamine monomers that have solubilizing $CF_3$ functionality.

The present invention provides a thick film encapsulant composition comprising (1) a polybenzoxazole precursor selected from one or more polyhydroxyamides and (2) an organic solvent.

A fired-on-foil ceramic capacitor coated with a polyhydroxyamide encapsulant, thermally cured and embedded in a printed wiring board is disclosed. The application and processing of the encapsulant is designed to be compatible with printed wiring board and integrated circuit (IC) package processes. It also provides protection to the fired-on-foil capacitor from moisture, printed wiring board fabrication chemicals prior to and after embedding into the structure, and accommodates mechanical stresses generated by localized differences in relative thermal expansion coefficients of the capacitor element and organic components without delaminating. Application of said composite encapsulant to the fired-on-foil ceramic capacitor allows the capacitor embedded inside the printed wiring board to pass 1000 hours of accelerated life testing conducted at 85° C., 85% relative humidity under 5 volts of DC bias.

Encapsulant compositions are disclosed comprising: A soluble polyhydroxyamide or a mixture of polyhydroxyamides that yields a polybenzoxazole upon heating (or other processing means including microwave, laser) to a sufficient temperature, an organic solvent, and optionally one or more of an inorganic electrically insulating filler, a defoamer and a colorant dye. The amount of water absorption is determined by ASTM D-570, which is a method known to those skilled in the art.

Applicants determined that the most stable polymer matrix is achieved with the use of polybenzoxazoles that also have low moisture absorption of 2% or less, preferably 1.5% or less, more preferably 1% or less. Polybenzoxazoles used in the compositions with water absorption of 1% or less tend to provide consolidated materials with preferred protection characteristics.

Polyhydroxyamide

Generally, the polyhydroxyamide component of the present invention can be represented by the general formula:

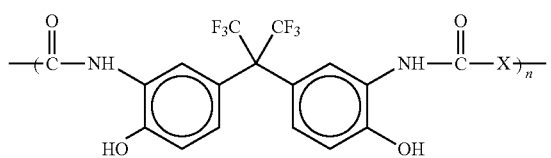

Where X is one or more than one of:

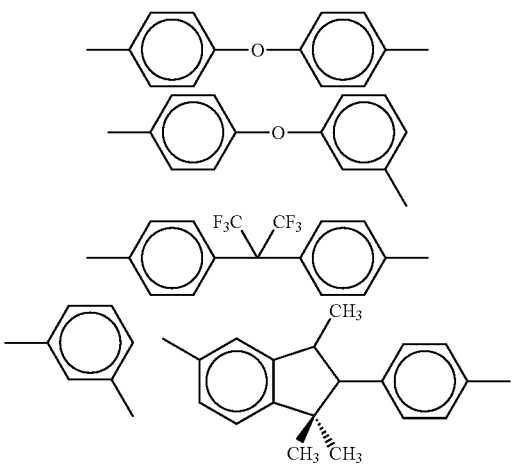

And a mixture of the structures above with a lesser amount of

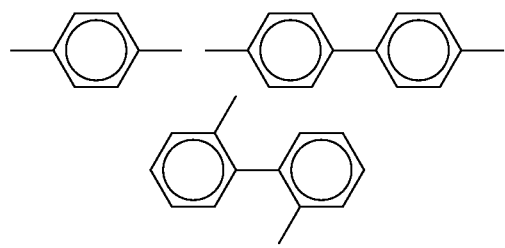

The polybenzoxazoles of the present invention are chosen such that their corresponding polyhydroxyamide precursors are soluble in screen printing solvents.

Polybenzoxazoles are not easily formulated into thick film pastes due to their limited solubility characteristics in acceptable screen print solvents. While some polyhydroxyamides precursors to polybenzoxazoles are known to be soluble in methanesulfonic acid, sulfuric acid, chloroform and THF, their solubility in traditional screen printing solvent families such as extended alcohols, ethers and acetates has not been fully explored. Furthermore, the solvents that are known to dissolve these polyhydroxyamides are not acceptable screen printing solvents and therefore have not been generally regarded as potential candidates for thick film paste formulations.

The polyhydroxyamides of the invention are prepared by reacting a suitable diacid chloride (or mixture of suitable diacid chlorides) with one or more selected diamines. The mole ratio of diacid chloride component to diamine component is preferably from between 0.9 to 1.1. Preferably, a slight molar excess of diacid chloride or diamines can be used at mole ratio of about 1.01 to 1.02. End capping agents, such as benzoic anhydride, can be added to control chain length of the polyhydroxyamide, and to assure that there are no amine terminated end groups in the polybenzoxazole.

Diacid chlorides useful in the practice of the present invention are terephthaloyl chloride, isophthaloyl chloride, 4,4'-oxybis(benzoyl chloride), 3,4'-oxybis(benzoyl chloride), 2,2-bis(4-benzoyl chloride)hexafluoropropane and the diacid chloride of 1,1,3-trimethyl-5-carboxy-3(p-carboxyphenyl) indan. Other diacid chlorides useful when used in combination at a lower mole ratio with the above diacid chlorides are 2,2-bis(4-benzoyl chloride)propane, the diacid chloride of diphenic acid, biphenyl-4,4'-diacid chloride, and 4,4'-methane-bis(benzoyl chloride). A hydroxy diamine of choice is 2,2-bis(3-amino-4-hydroxy)hexafluoro-propane (6F-AP). A less soluble hydroxy diamine, 3,3'-dihydroxy-4,4'-diamino-biphenyl, can be used in combination with 6F-AP with the ratio determined by the solubility of the polyhydroxyamide in the desired screen printing solvent.

The thick film compositions comprise an organic solvent. The choice of solvent or mixtures of solvents will depend in part on the polyhydroxyamide used in the composition. Any chosen solvent or solvent mixtures must dissolve the polybenzoxazole precursor. The solvent must not have a high affinity for moisture absorption since the encapsulant paste may be in contact with ambient air for an hour or more. If too much water is absorbed into the encapsulant paste, the polyhydroxyamide could loose solubility causing the screen or stencil to become blocked. Solvents known to be useful in accordance with the practice of the present invention include organic liquids having both (i.) a Hanson polar solubility parameter between about 2 and 3 and (ii) a normal boiling point ranging from between and including any two of the following temperatures 190, 200, 210, 220, 230, 240, and 250° C. In one embodiment of the present invention, a useful solvent is Dowanol® PPH. Cosolvents may be added provided that the polyhydroxyamide is still soluble, performance in screen-printing is not adversely affected, and lifetime storage is also not adversely affected. Examples of common screen printing solvents are: terpineol, Texanol, DBE solvents, butyl Carbitol acetate, butyl Carbitol acetate, dipropylene glycol butyl ether, and dibutyl Carbitol.

Generally, thick-film compositions are mixed and then blended on a three-roll mill. Pastes are typically roll-milled for three or more passes at increasing levels of pressure until a suitable dispersion has been reached. After roll milling, the pastes may be formulated to printing viscosity requirements by addition of solvent.

Curing of the paste or liquid composition is accomplished by any number of standard curing methods including convection heating, forced air convection heating, vapor phase condensation heating, conduction heating, infrared heating, induction heating, or other techniques known to those skilled in the art. These pastes can be cured at temperatures not exceeding about 450° C. High temperatures, above about 350° C., are preferred to fully convert the soluble intermediate to the polybenzoxazole structure.

Procedures used in the testing of the compositions of the invention and for the comparative examples are provided as follows:

Insulation Resistance

Insulation resistance of the capacitors is measured using a Hewlett Packard high resistance meter, and is reported in Gohms.

Temperature Humidity Bias (THB) Test

The THB Test of ceramic capacitors embedded in printed wiring boards involves placing the printed wiring board in an environmental chamber and exposing the capacitors to 85° C., 85% relative humidity and a 5 volt DC bias for 1000 hours. Insulation resistance of the capacitors is monitored periodically. Failure of the capacitor is defined as a capacitor showing less than 50 Meg-ohms in insulation resistance.

Brown Oxide Test

A capacitor is exposed to a Mac Dermid (Mac Dermid Incorporated of Waterbury Conn.) brown oxide treatment in the following series of steps: (1) 60 sec. soak in a solution of 4-8% $H_2SO_4$ at 40° C., (2) 120 sec. soak in DI water at room temperature, (3) 240 sec. soak in a solution of 3-4% NaOH with 5-10% amine at 60° C., (4) 120 sec. soak in DI water at room temperature, (5) 120 sec. soak in a solution of 20 ml/l $H_2O_2$ and $H_2SO_4$ acid with additive at 40° C., (6) a soak for 120 sec. at 40° C. in a solution made by mixing 280 ml of Mac Dermid Part A chemical solution diluted in 1 liter of DI water plus 40 ml of Mac Dermid Part B chemical solution diluted in 1 liter of DI water, and (7) a deionized water soak for 480 sec. at room temperature. Insulation resistance of the capacitor is then measured after the exposure steps Insulation resistance of the capacitor was then measured after the test and failure was defined as a capacitor showing less than 50 Meg-Ohms.

Encapsulant Film Moisture Absorption Test

The ASTM D570 method is used where polyhydroxyamide solution is coated with a 20-mil doctor knife on a one oz. copper foil substrate. The wet coating is dried at 190° C. for about 1 hour in a forced draft oven to yield a polyhydroxyamide film of 2 mils thickness. In order to obtain a thickness of greater than 5 mils as specified by the test method, two more layers are coated on top of the dried polyhydroxyamide film with a 30 min 190° C. drying in a forced draft oven between the second and third coating. The three-layer coating is dried 1 hr at 190° C. in a forced draft oven and is cured in a multizone belt furnace under a nitrogen atmosphere using the following profile:

| Parameter | Setting |
|---|---|
| Belt speed | 5 in/min |
| Pass number one: | |
| Zone 1 | 150° C. |
| Zone 2 | 170° C. |
| Zone 3 | 210° C. |
| Zone 4 | 240° C. |
| Zone 5 | 270° C. |
| Zone 6 | 300° C. |
| Zone 7 | 330° C. |
| Zone 8 | 360° C. |
| Pass number two: | |
| Zone 1 | 200° C. |
| Zone 2 | 230° C. |
| Zone 3 | 260° C. |
| Zone 4 | 290° C. |
| Zone 5 | 320° C. |
| Zone 6 | 350° C. |
| Zone 7 | 380° C. |
| Zone 8 | 410° C. |

The polybenzoxazole film thus formed is removed from the copper substrate by etching the copper using commercially available acid etch technology. Samples of one inch by 3-inch dimensions are cut from the free-standing film and dried at 120° C. for 1 hour. The strips are weighed and immersed in deionized water for 24 hrs. Samples are blotted dry and weighed to determine the weight gain so that the percent water absorption can be calculated. Film samples were also placed in an 85/85 chamber for 48 hours to measure the water uptake of the samples under these conditions.

The following glossary contains a list of names and abbreviations for each ingredient used:

| CTE | Coefficient of thermal expansion |
|---|---|
| DI water | Deionized water |
| DMAC | Dimethylacetamide |
| Dowanol PPH | Propylene glycol phenyl ether |
| 6F-AP | 2,2-bis(3-amino-4-hydroxyphenyl)-hexafluoropropane |
| Mw | Weight average molecular weight |
| Mn | Number average molecular weight |
| NMP | N-methyl-2-pyrrolidinone |
| PBO | Polybenzoxazole |
| Tg | Glass transition temperature |
| THF | Tetrahydrofuran |
| THB | Temperature, humidity, bias of 85° C., 85% RH and 5 volt DC |

EXAMPLE 1

Polyhydroxyamide 1 Preparation

In a dry 3 neck round bottom flask with mechanical stirrer and nitrogen inlet was added 130.2 grams of anhydrous DMAC and 12.410 grams of 6F-AP. The solution was cooled to 5° C. and 10.002 grams of 4,4'-oxybis(benzoyl chloride) was added. The reaction temperature rose to 20° C. during the addition and then dropped to 10° C. with ice bath 30 cooling. The solution was allowed to warm to room temperature and was stirred overnight. The product polyhydroxyamide was precipitated in DI water in an air driven Waring blender, and was collected by filtration. The solid product was washed with DI water using the blender and filtered and this was repeated again at which point the filtrate had a pH of 4. The solid was dried in a nitrogen vacuum oven at 100° C. to yield 23.0 grams. The molecular weight by size exclusion chromatography was Mw of 118,100, Mn of 54,400.

EXAMPLE 2

Polyhydroxyamide 2 Preparation

In a dry 3 neck round bottom flask with mechanical stirrer and nitrogen inlet was added 158.86 grams of anhydrous DMAC and 18.03 grams of 6F-AP. The solution was cooled to 10° C. and 10.00 grams of isophthaloyl chloride was added. The reaction temperature rose to 11° C. during the addition with ice bath cooling. The solution was allowed to warm to room temperature and was stirred overnight. The product polyhydroxyamide was precipitated in DI water in an air driven Waring blender, and was collected by filtration. The solid product was washed with DI water using the blender and filtered and this was repeated again at which point the filtrate had a pH of 5. The solid was dried in a nitrogen vacuum oven at 110° C. to yield 25.59 grams. The molecular weight by size exclusion chromatography was Mw of 170,300, Mn of 51,700.

EXAMPLE 3

Polyhydroxyamide 1 Paste Production

A solution of 20.45 grams of the polyhydroxyamide of Example 1 in 115.84 grams of Dowanol PPH was prepared with mechanical stirring at 80° C. for 5 hours. The clear solution was filtered with applied pressure through a 10-micron filter. A siloxane-based coating aid (0.14 g) was added to the paste with stirring to improve the screen printing characteristics of the paste.

EXAMPLE 4

Preparation of Ceramic Coupons Containing Encapsulated Ceramic Capacitors, Analysis of Chemical Stability of Encapsulant Capacitors on commercial 96% alumina substrates were covered by encapsulant compositions and used as a test vehicle to determine the encapsulant's resistance to selected chemicals. The test vehicle was prepared in the following manner as schematically illustrated in FIG. 1A through 1G.

Figure 1B:
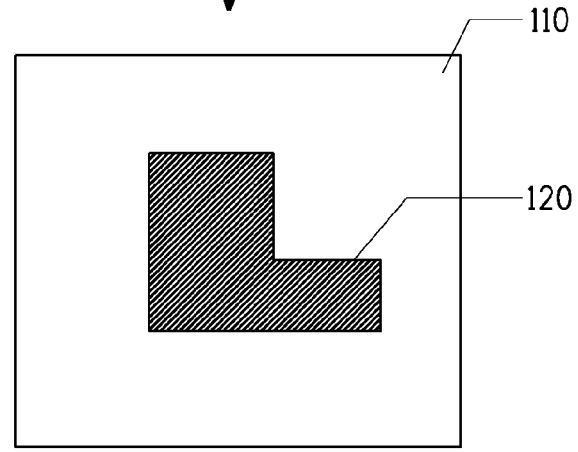

As shown in FIG. 1A, electrode material (EP 320 obtainable from E. I. du Pont de Nemours and Company) was screen-printed onto the alumina substrate to form electrode pattern 120. As shown in FIG. 1B, the area of the electrode was 0.3 inch by 0.3 inch and contained a protruding "finger" to allow connections to the electrode at a later stage. The electrode pattern was dried at 120° C. for 10 minutes and fired at 930° C. under copper thick-film nitrogen atmosphere firing conditions.

Figure 1C:
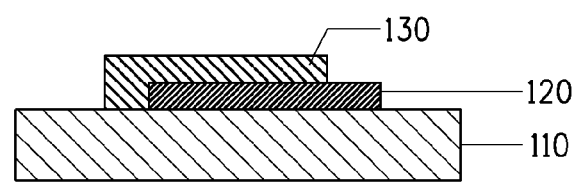
Figure 1D:
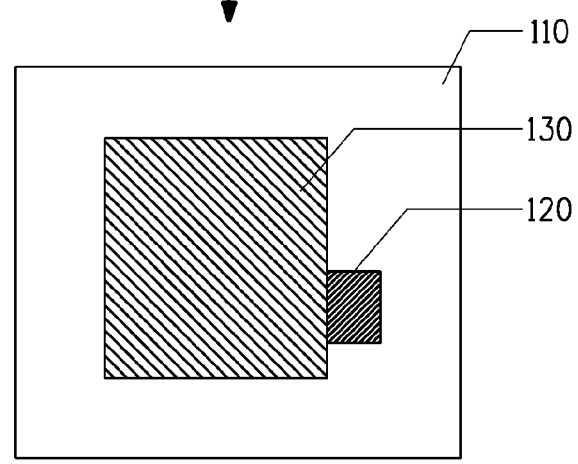

As shown in FIG. 1C, dielectric material (EP 310 obtainable from E.I. du Pont de Nemours and Company) was screen-printed onto the electrode to form dielectric layer 130. The area of the dielectric layer was approximately 0.33 inch by 0.33 inch and covered the entirety of the electrode except for the protruding finger. The first dielectric layer was dried at 120° C. for 10 minutes. A second dielectric layer was then applied, and also dried using the same conditions. A plan view of the dielectric pattern is shown in FIG. 1D.

Figure 1E:
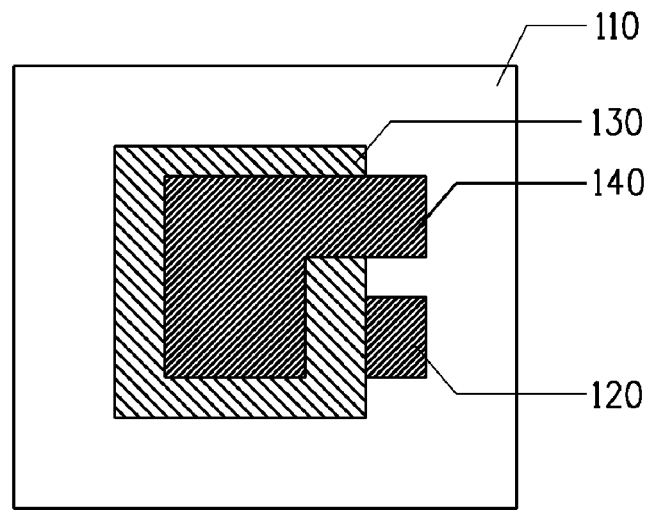

As shown in FIG. 1E, copper paste EP 320 was printed over the second dielectric layer to form electrode pattern 140. The electrode was 0.3 inch by 0.3 inch but included a protruding finger that extended over the alumina substrate. The copper paste was dried at 120° C. for 10 minutes.

The first dielectric layer, the second dielectric layer, and the copper paste electrode were then co-fired at 930° C. under copper thick-film firing conditions.

Figure 1F:
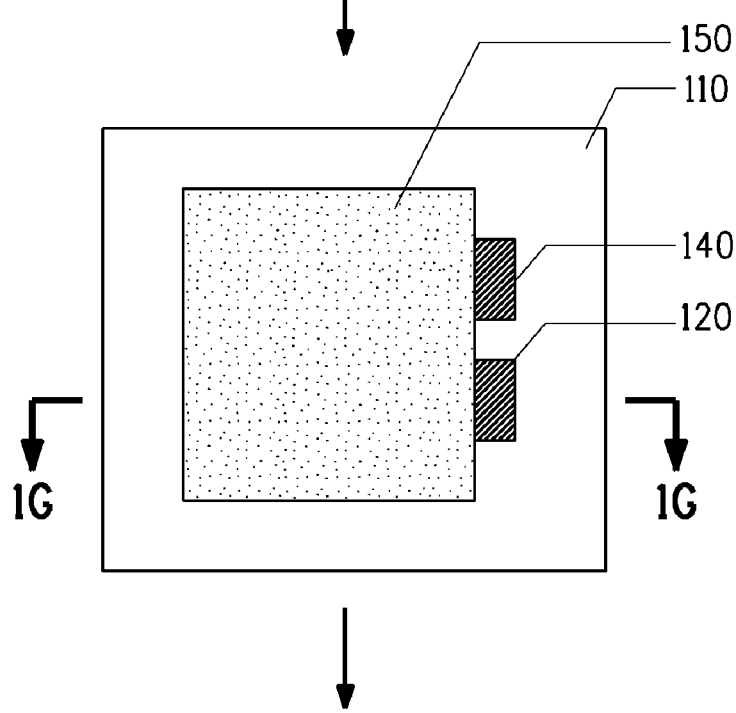
Figure 1G:
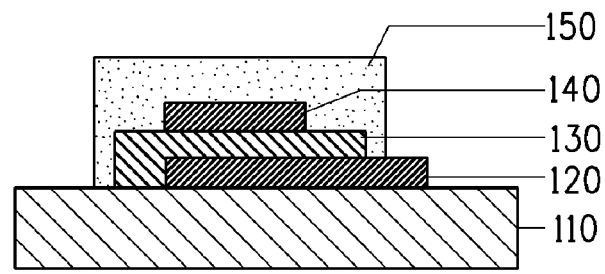

For Example 4 the encapsulant composition of Example 3 was screen printed through a 180 mesh screen over the entirety of the capacitor electrode and dielectric except for the two fingers using the pattern shown in FIG. 1F to form a 0.4 inch by 0.4 inch encapsulant layer 150. The encapsulant layer was dried for 10 minutes at 120° C. Another layer of encapsulant was printed with the formulation prepared in Example 3 through a 180-mesh screen directly over the first encapsulant layer and dried for 10 minutes at 120° C. A side view of the final stack is shown in FIG. 1G. The encapsulant was then baked under nitrogen in a forced draft oven at 190° C. for 30 minutes. The coupon was then cured in a multizone belt furnace under nitrogen atmosphere using the following profile:

| Parameter | Setting |
| --- | --- |
| Belt speed | 5 in/min |
| First pass: | |
| Zone 1 | 150° C. |
| Zone 2 | 170° C. |
| Zone 3 | 210° C. |
| Zone 4 | 240° C. |
| Zone 5 | 270° C. |
| Zone 6 | 300° C. |
| Zone 7 | 330° C. |
| Zone 8 | 360° C. |
| Pass number two: | |
| Zone 1 | 200° C. |
| Zone 2 | 230° C. |
| Zone 3 | 260° C. |
| Zone 4 | 290° C. |
| Zone 5 | 320° C. |
| Zone 6 | 350° C. |
| Zone 7 | 380° C. |
| Zone 8 | 410° C. |

The final cured thickness of the encapsulant was approximately 10 microns.

After encapsulation, the average capacitance of the capacitors was 42.3 nF, the average loss factor was 1.6%, the average insulation resistance was 3.1 Gohms. Coupons were then subjected to the brown oxide test described previously. The average capacitance, loss factor, and insulation resistance were 42.7 nf, 1.7%, 1.8 Gohm respectively after the treatment. Unencapsulated coupons did not survive the acid and base exposures. The capacitors were then subjected to a 5V DC bias and placed in a 85/85 oven for 100 hours after which time the capacitance, loss and insulation resistance were measured again. The average values were 41.7 nf, 1.8%, and 1.1 Gohm respectively.

EXAMPLE 5

Figure 2A:
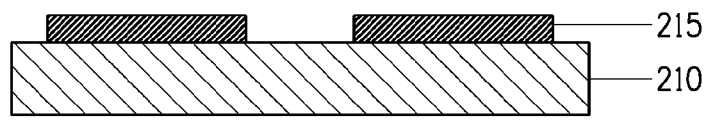
FIG. 2A-2E show the preparation of capacitors on copper foil substrates that were covered by encapsulant.
Figure 2B:
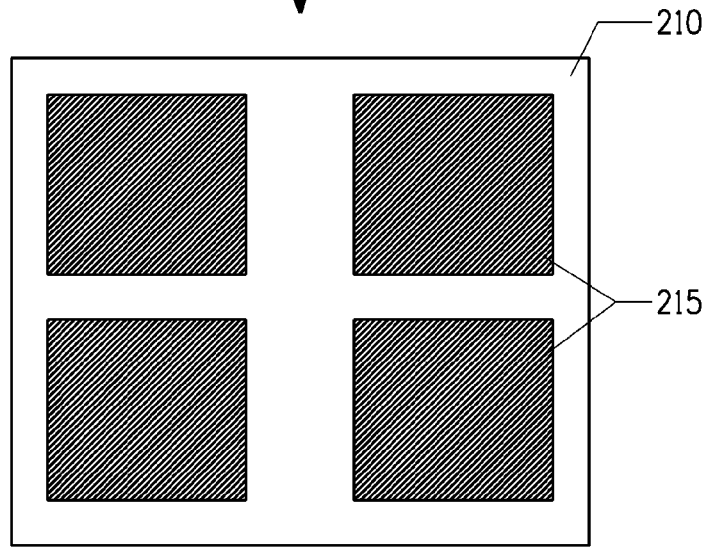

Preparation of Encapsulated Fired-On Foil Capacitors, Lamination with Prepreg and Core to Determine Adhesive Strength and Delamination Tendency Fired-on-foil capacitors were fabricated for use as a test structure using the following process. As shown in FIG. 2A, a 1 ounce copper foil 210 was pretreated by applying copper paste EP 320 (obtainable from E. I. du Pont de Nemours and Company) as a preprint to the foil to form the pattern 215 and fired at 930° C. under copper thick-film firing conditions. Each preprint pattern was approximately 1.67 cm by 1.67 cm. A plan view of the preprint is shown in FIG. 2B.

Figure 2C:
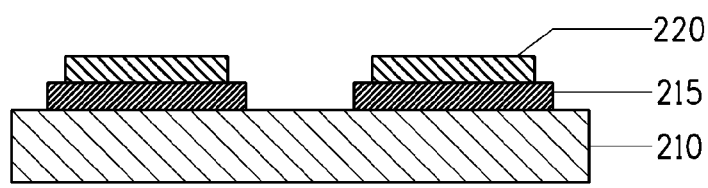

As shown in FIG. 2c, dielectric material (EP 310 obtainable from E.I. du Pont de Nemours and Company) was screen-printed onto the preprint of the pretreated foil to form pattern 220. The area of the dielectric layer was 1.22 cm by 1.22 .cm. and within the pattern of the preprint. The first dielectric layer was dried at 120° C. for 10 minutes. A second dielectric layer was then applied, and also dried using the same conditions.

Figure 2D:
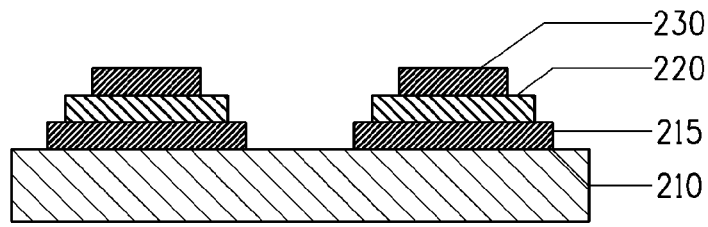

As shown in FIG. 2D, copper paste EP 320 was printed over the second dielectric layer and within the area of the dielectric to form electrode pattern 230 and dried at 120° C. for 10 minutes. The area of the electrode was 0.9 cm by 0.9 cm.

The first dielectric layer, the second dielectric layer, and the copper paste electrode were then co-fired at 930° C. under copper thick-film firing conditions.

Figure 2E:
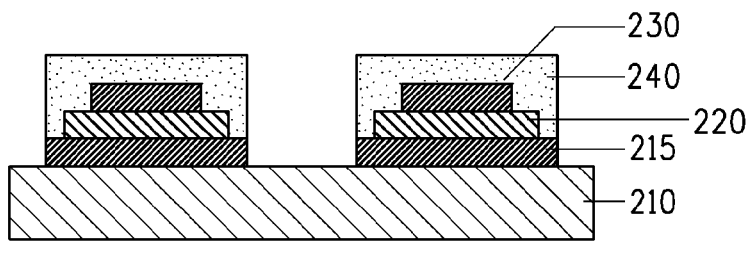

The encapsulant composition as described in Example 3 was printed through a 180-mesh screen over capacitors to form encapsulant layer 240 using the pattern as shown in FIG. 2E. The encapsulant was dried at 120° C. for ten minutes. A second encapsulant layer was then printed directly over the first layer using the paste prepared in Example 3 with a 180-mesh screen. The two-layer structure was then baked for 10 min at 120° C. then cured at 1 90° C. under nitrogen for 30 minutes to yield a consolidated two-layer composite encapsulant.

The foils were then cured in a multi-zone belt furnace under nitrogen atmosphere using the following profile:

| Parameter | Setting |
| --- | --- |
| Belt speed | 5 in/min |
| Zone 1 | 150° C. |
| Zone 2 | 170° C. |
| Zone 3 | 210° C. |
| Zone 4 | 240° C. |
| Zone 5 | 270° C. |
| Zone 6 | 300° C. |
| Zone 7 | 330° C. |
| Zone 8 | 360° C. |
| Pass number two: | |
| Zone 1 | 200° C. |
| Zone 2 | 230° C. |
| Zone 3 | 260° C. |
| Zone 4 | 290° C. |
| Zone 5 | 320° C. |
| Zone 6 | 350° C. |
| Zone 7 | 380° C. |
| Zone 8 | 410° C. |

Figure 2F:
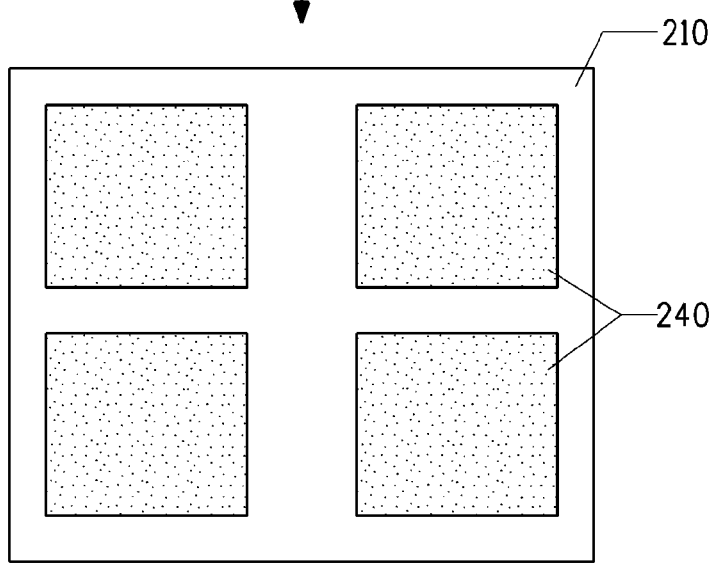
FIG. 2F shows a plan view of the structure.
Figure 2G:
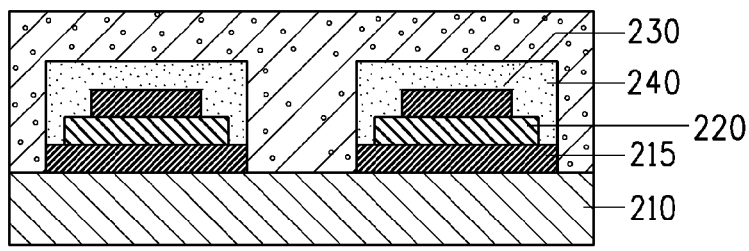
FIG. 2G shows the structure after lamination to resin.

The final cured encapsulant thickness was approximately 10 microns. A plan view of the structure is shown in FIG. 2F. The component side of the foil was laminated to 1080 BT resin prepreg 250 at 375° F. at 400 psi for 90 minutes to form the structure shown in FIG. 2G. The adhesion of the prepreg to the encapsulant was tested using the IPC-™-650 adhesion test number 2.4.9. The adhesion results are shown below. Some foils were also laminated with 1080 BT resin prepreg and BT core in place of copper foil. These samples were subjected to 5 successive solder floats at 260° C., each exposure lasting two minutes, to determine the tendency for the structure to delaminate during thermal cycling. Visual inspection was used to determine if delamination occurred.

Results are shown below:

| Dry Cycle | Cure Cycle | Encapsulant over Cu (lb force/inch) | Encapsulant over Capacitor (lb force/inch) |
| --- | --- | --- | --- |
| 120° C./10 min | 410° C. oven | 3.0 | 3.3 |

The failure mode was within the capacitor structure, not the encapsulant interface.

| Dry Cycle | Cure Cycle | Delamination |
| --- | --- | --- |
| 120° C./10 min | 360° C. oven | no delamination after 5 cycles |

The control (no encapsulant) delaminated 30 seconds into the first solder float.

EXAMPLE 6

Polyhydroxyamide 2 Paste Production

The polyhydroxyamide of Example 2 formed a cloudy solution in Dowanol® PPH that was still cloudy after filtering through a 10-micron filter, but when processed as Examples 4 and 5, comparable results were obtained. The polyhydroxyamide of Example 2 did form a clear solution in NMP that yielded a protective coating, but this solvent is not usable for screen print applications due to attack of the screen emulsion and the squeegee. This polyhydroxyamide was found to be insoluble in several other screen print solvents such as DBE solvents, terpineol, or Texanol. The encapsulant gave good results with Bond Film oxide treatment and did not delaminate with IR solder reflow.

COMPARATIVE EXAMPLE 1

Polyhydroxyamide Preparation and Evaluation

In a dry 3 neck round bottom flask with mechanical stirrer and nitrogen inlet was added 322.4 grams of anhydrous DMAC and 18.029 grams of 6F-AP. The solution was cooled to 5° C. and 10.090 grams of terephthaloyl chloride was added. The reaction temperature rose to 11° C. during the addition with ice bath cooling. The solution was allowed to warm to room temperature and was stirred overnight. The product polyhydroxyamide was precipitated in DI water in an air driven Waring blender, and was collected by filtration. The solid product was washed with DI water using the blender and filtered and this was repeated again at which point the filtrate had a pH of 5. The solid was dried in a nitrogen vacuum oven at 100° C. to yield 23.4 grams. The molecular weight by size exclusion chromatography was Mw of 91,400, Mn of 36,300. The polyhydroxyamide did not dissolve in Dowanol® PPH, but did dissolve in NMP, and this yielded a protective coating. However, this solvent is not usable for screen print applications due to attack of the screen emulsion and the squeegee. This comparative example indicates that the polyhydroxyamide is not soluble in Dowanol® PPH or in several other screen print solvents such as DBE solvents terpineol, or Texanol.a polybenzoxazole. However, the corresponding PBO is reported by L. R. Denny et. al. at the $22^{nd}$ International SAMPE Technical Conference, Nov. 6-8, 1990 and by Houtz et. al., Polymer Preprints, 1994, 35 (1), 437-8 to be soluble in a non-screen print solvent methanesulfonic acid.

COMPARATIVE EXAMPLE 2

A solution of 12.9919 grams of 4,4'-oxybis(benzoic acid) and 18.3112 grams of 6F-AP in 196 grams of o-dichlorobenzene was stirred as 120.25 grams of polyphosphoric acid trimethylsilyl ester (PPSE) was added. The mixture was heated slowly to 135° C. and held at this temperature for 24 hours. The temperature was raised to 165° C. and held at this temperature for 18 hours, then cooled to room temperature and the product was precipitated out in 3 liters of methanol in an air driven Waring blender. The polymer was collected by filtration and the solid was blended three times in a total of 2 liters methanol, filtering each time to remove soluble impurities. Further acidic impurities were removed from the polymer by Soxhlet extraction in 33% aqueous ammonium hydroxide for 48 hours and the polymer was then washed with DI water three times until neutral rinse was obtained. The polymer was dried in a 140° C. vacuum oven for 18 hours to yield 23.4 grams of the purified polybenzoxazole (PBO) product, with Mw of 151,000 and Mn of 40,300. Although the polyhydroxyamide precursor of this PBO was soluble in Dowanol® PPH as seen in Examples 2 and 3, the PBO was not. It was also not soluble in other screen print solvents, DBE solvents, Texanol, terpineol, butyl Carbitol acetate, or Carbitol acetate. It was soluble in NMP, but on attempts to use this as a screen printing composition, even though the NMP attacks both the screen emulsion and squeegee, enough moisture absorbed into the hydrophilic NMP solvent to render the PBO to be less soluble in the wet NMP. This made it very difficult to obtain any useful coating, so therefore the screen printing operation had to be terminated.

COMPARATIVE EXAMPLE 3

Polysulfone

An encapsulant made with polysulfone delaminated with IR solder reflow and due to the highly polar sulfone functionality is not conducive to providing good THB results. Samples were prepared in a manner consistent with that described in Example 4 using polysulfone as the encapsulant. Bisphenol-A Polysulfone was dissolved in Dowanol® PPH at a concentration of 15% to prepare a screen-printable paste. The paste was printed in a manner consistent with that described in Example 4. The screen printing solvent was evaporated by heating the printed substrates at 240° C. for 30 min in a nitrogen purged convection oven.

After encapsulation, the coupons were then subjected to the brown oxide test described previously. The average capacitance, loss factor, and insulation resistance were 39.2 nf, 1.8%, 2.8 Gohm respectively after the treatment. The capacitors were then subjected to a 5V DC bias and placed in a 85/85 oven for 100 hours after which time the capacitance, loss and insulation resistance were measured again. The average values were 38.2 nf, 2.1%, and 0.07 Gohm respectively. The decline in average insulation resistance indicates the polysulfone did not adequately protect the underlying capacitor during bias testing under humid conditions. In like manner a sulfone-containing PBO as described in WO 2007/034716 A1 to M. Hasegawa et. al., would be expected to have reduced THB resistance.

COMPARATIVE EXAMPLE 4

XPI-2

High performance soluble polyimides of low moisture absorption, such as those described in Examples 2-4 of EL-0676, have been shown to have good encapsulant properties, especially adhesion during IR solder reflow and good THB resistant results. These polyimides can withstand selected oxide treatment processing especially if the contact time in high pH solution is controlled. However, if the soak time is longer than desired, the high pH oxide treatment process will attack the polyimide. As a result of this, it is evident that even very high performance polymers may not provide all of the protection that is required for conventional processing of encapsulated ceramic capacitors. The improved performance of Example 4 in brown oxide indicates the performance advantage of PBO over high performance polyimide candidates. This was a surprising result. Both polyimides and PBOs are considered to have good stability to different chemicals, but the PBO candidate has an unexpected advantage when high pH processing is required.

What is claimed is:

1. A composition for coating an electronic component, the composition comprising:
   at least one polyhydroxyamide configured to form a polybenzoxazole on heating; and
   an organic solvent,
   wherein:
   the polyhydroxyamide is represented by formula:

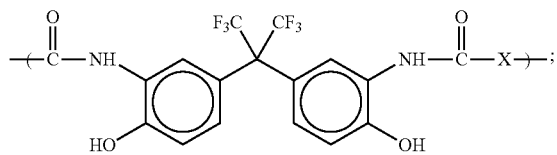

each X is represented by:

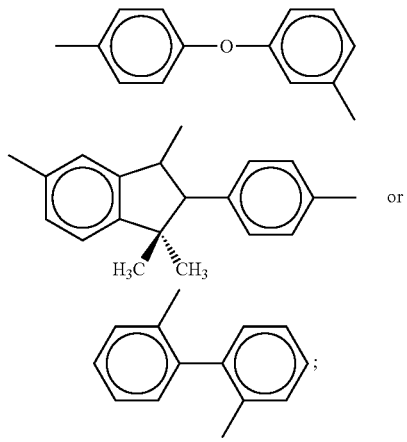

the polyhydroxyamide is soluble in the organic solvent which is a screen printing solvent;
   the composition is a screen-printable encapsulant composition; and
   the screen printing solvent comprises propylene glycol phenyl ether, terpineol, 2,2,4-trimethyl-1,3-pentanediol monoisobutyrate, dibasic ether solvents, butyl carbitol acetate, dipropylene glycol butyl ether, or dibutyl carbitol.

2. The composition of claim 1, wherein the polyhydroxyamide has a water absorption of 2% or less and a Tg greater than 260° C.

3. The composition of claim 1 further comprising at least one of each of the following: an electrically-insulated filler, a defoamer, a colorant, and an additional organic solvent.

4. A polybenzoxazole encapsulant composition formed by heating the screen-printable encapsulant composition of claim 1, wherein the polybenzoxazole encapsulant composition is formed on an embedded fired-on-foil ceramic capacitor into an encapsulated capacitor and wherein the encapsulant composition is configured to provide protection to the capacitor when the encapsulated capacitor is immersed in sulfuric acid or sodium hydroxide having a concentration of up to 30%.

5. The polybenzoxazole encapsulant composition of claim 4 having a water absorption of 2% or less.

6. The polybenzoxazole encapsulant composition of claim 4 having a water absorption of 1% or less.

7. The polybenzoxazole encapsulant composition of claim 4, wherein said heating is conducted at a temperature of less than or equal to 450° C.

8. The polybenzoxazole encapsulant composition of claim 4, wherein the encapsulant composition adheres to the capacitor, and wherein the adhesion of the encapsulant to a capacitor is greater than 2 lb force/inch.

9. The composition of claim 4, wherein said heating is conducted at a temperature from about 350° C. to about 450° C.

10. The composition of claim 1 applied as an encapsulant to an electronic component.

11. The composition of claim 1, further comprising one or more inorganic electrically-insulating fillers, defoamers, or colorants, and applied as an encapsulant to an electronic component.

12. The composition of claim 1, wherein the screen printing solvent has a Hansen solubility parameter from about 2 to about 3 and a normal boiling point from about 190° C. to about 250° C.

13. A method of encapsulating a fired-on-foil ceramic capacitor with a polybenzoxazole encapsulant, the method comprising
providing a composition of a polyhydroxyamide dissolved in an organic solvent;
screen printing the composition on a fired-an-foil capacitor; and
heating the composition to cure the composition and form a fired-on-foil ceramic capacitor encapsulated with a polybenzoxazole;
wherein:
the polyhydroxyamide has a water absorption of 2% or less and a Tg greater than 260° C.;
the fired-on-foil ceramic capacitor encapsulated with the polybenzoxazole does not degrade when immersed in sulfuric acid or sodium hydroxide having a concentration of up to 30%; and
the organic solvent comprises propylene glycol phenyl ether, terpineol, 2,2,4-trimethyl-1,3-pentanediol monoisobutyrate, dibasic ether solvents, butyl carbitol acetate, dipropylene glycol butyl ether, or dibutyl carbitol.

14. The method of claim 13, wherein the composition is cured at a temperature equal to or less than about 450° C.

15. The method of claim 13, wherein the composition further comprises one or more electrically-insulated fillers, defoamers or colorants.

16. The method of claim 13, wherein the polyhydroxyamide comprises repeating units represented by the formula:

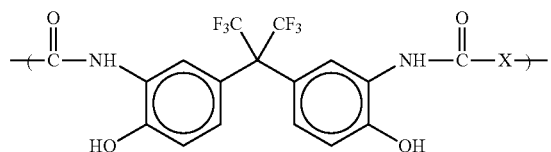

where each X is:

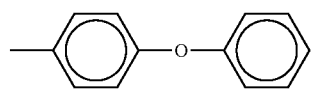

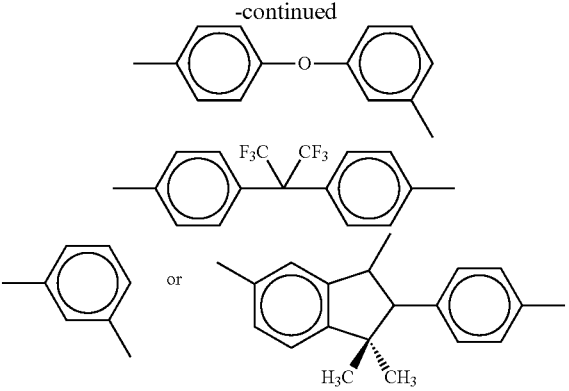

with a lesser amount of

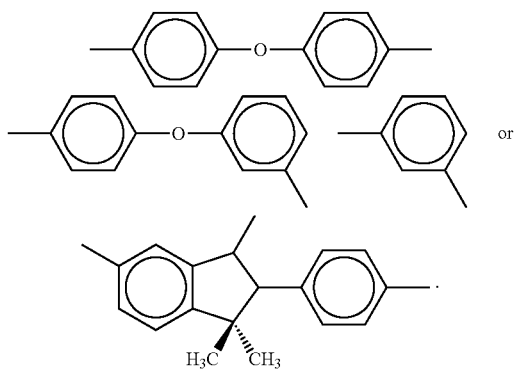

17. The polybenzoxazole encapsulant composition of claim 13, wherein said providing a composition of a polyhydroxyamide comprises preparing the polyhydroxyamide from the reaction of 2,2-bis(3-amino-4-hydroxyphenyl) hexafluoropropane with a bis-benzoyl chloride selected from the group consisting of: terephthaloyl chloride; isophthaloyl chloride; 4,4'-oxybis(benzoyl chloride); 3,4'-oxybis(benzoyl chloride); 2,2-bis(4-benzoyl chloride)hexafluoropropane; 3-(4-(chlorocarbonyl)phenyl)-1,1,3-trimethyl-2,3-dihydro-1H-indene-5-carbonyl chloride; 2,2-bis(4-benzoyl chloride) propane; biphenyl-2,2'-dicarbonyl dichloride; biphenyl-4,4'-diacid chloride; 4,4'-methane-bis(benzoyl chloride), and a mixture of any two or more thereof.

* * * * *

UNITED STATES PATENT AND TRADEMARK OFFICE
CERTIFICATE OF CORRECTION

| | | |
|---|---|---|
| PATENT NO. | : 8,357,753 B2 | Page 1 of 1 |
| APPLICATION NO. | : 12/141137 | |
| DATED | : January 22, 2013 | |
| INVENTOR(S) | : Summers et al. | |

It is certified that error appears in the above-identified patent and that said Letters Patent is hereby corrected as shown below:

In the Specifications

In Column 7, Line 11, delete "steps" and insert -- steps. --, therefor.

In Column 8, Line 25, delete "bath 30 cooling." and insert -- bath cooling. --, therefor.

In Column 10, Line 63, delete "1 90° C." and insert -- 190° C. --, therefor.

In the Claims

In Column 15, Line 3, in Claim 13, delete "comprising" and insert -- comprising: --, therefor.

Signed and Sealed this
Thirteenth Day of May, 2014

Michelle K. Lee
*Deputy Director of the United States Patent and Trademark Office*